United States Patent [19]

Trost

[11] Patent Number: 4,504,144
[45] Date of Patent: Mar. 12, 1985

[54] SIMPLE ELECTROMECHANICAL TILT AND FOCUS DEVICE

[75] Inventor: David Trost, Fairfield, Conn.

[73] Assignee: The Perkin-Elmer Corporation, Norwalk, Conn.

[21] Appl. No.: 395,414

[22] Filed: Jul. 6, 1982

[51] Int. Cl.³ .............................................. G03B 27/42
[52] U.S. Cl. .................................... 356/150; 250/201; 355/53
[58] Field of Search .............. 356/150; 355/53; 72/11, 72/12; 250/201

[56] References Cited

U.S. PATENT DOCUMENTS

| Re. 30,601 | 5/1981 | Horr et al. | 355/53 |
|---|---|---|---|
| 4,084,903 | 4/1978 | Pircher | 355/53 |
| 4,344,160 | 8/1982 | Gabriel et al. | 73/597 |
| 4,349,254 | 9/1982 | Jyojiki et al. | 250/201 |
| 4,383,757 | 5/1983 | Phillips | 250/201 |
| 4,405,229 | 9/1983 | Mayer | 355/53 |
| 4,431,304 | 2/1984 | Mayer | 355/53 |

Primary Examiner—R. A. Rosenberger
Attorney, Agent, or Firm—Thomas P. Murphy; Edwin T. Grimes; Francis L. Masselle

[57] ABSTRACT

An apparatus automatically for correcting tilt and focus errors of a wafer in a mask projection system for a plurality of subfields on the wafer which vary in position according to a known scheme. The tilt and focus of each subfield on the wafer is individually corrected by three axial actuators operating on the variable X and Y coordinates of the center of each subfield and its tilt and focus errors.

5 Claims, 5 Drawing Figures

SIMPLE ELECTROMECHANICAL TILT AND FOCUS DEVICE

BACKGROUND OF THE INVENTION

In the manufacture of integrated circuits an important step is the projection of circuit patterns contained on a mask or reticle onto a wafer coated with photoresist which is developed in preparation for further steps in the process. In mask projection systems such as described in U.S. Pat. No. 4,068,947 entitled Optical Projection and Scanning Apparatus and having the same assignee as the present application, it is essential that the pattern on the mask be perfectly focused onto the wafer prior to actual exposure of the mask pattern onto the wafer. Otherwise, the exposed pattern will be out of focus or fuzzy which substantially affects resolution of the pattern lines. Such an automatic focusing system is described in U.S. patent application Ser. No. 146,532 entitled Wafer Auto-Focus and Auto-Flattener now U.S. Pat. No. 4,344,160 and having the same assignee as the present application.

In such systems the entire wafer is exposed substantially at the same time by scanning a light source across the mask and onto the wafer. In such a system it is also important that the wafer be substantially untilted from a defined plane since this also affects focus and resolution. However, inasmuch as the wafer in such systems is exposed substantially all at once, the tilt of the entire wafer is correctable only once, i.e., prior to each exposure.

In step and repeat projection systems this is not the case. In such systems it is feasible to correct focus and tilt for each subfield of wafer prior to exposure of that subfield.

The present invention relates to such a system.

BRIEF SUMMARY OF THE PRESENT INVENTION

The present invention relates to an an apparatus which continually and automatically focuses and corrects tilt of a wafer in a step and repeat or similar system prior to and during exposure of each subfield.

In particular the present invention comprises three servo motors in operative contact with a wafer mounting table. The servo motors are placed in a generally triangular relationship and dependent on their energization are capable of moving the table along the focal axis as well as tilting the table about X and Y axes which move in accordance with the X and Y coordinates of the center point of the particular subfield whose focus and tilt are being corrected. Focus and tilt error data as well as the variable X and Y coordinates of the area being exposed on the wafer and certain constants are provided to an analog circuit which provides the appropriate inputs to the three servo motors for positioning the table and wafer in correct focus and tilt.

DESCRIPTION

Figure 1:
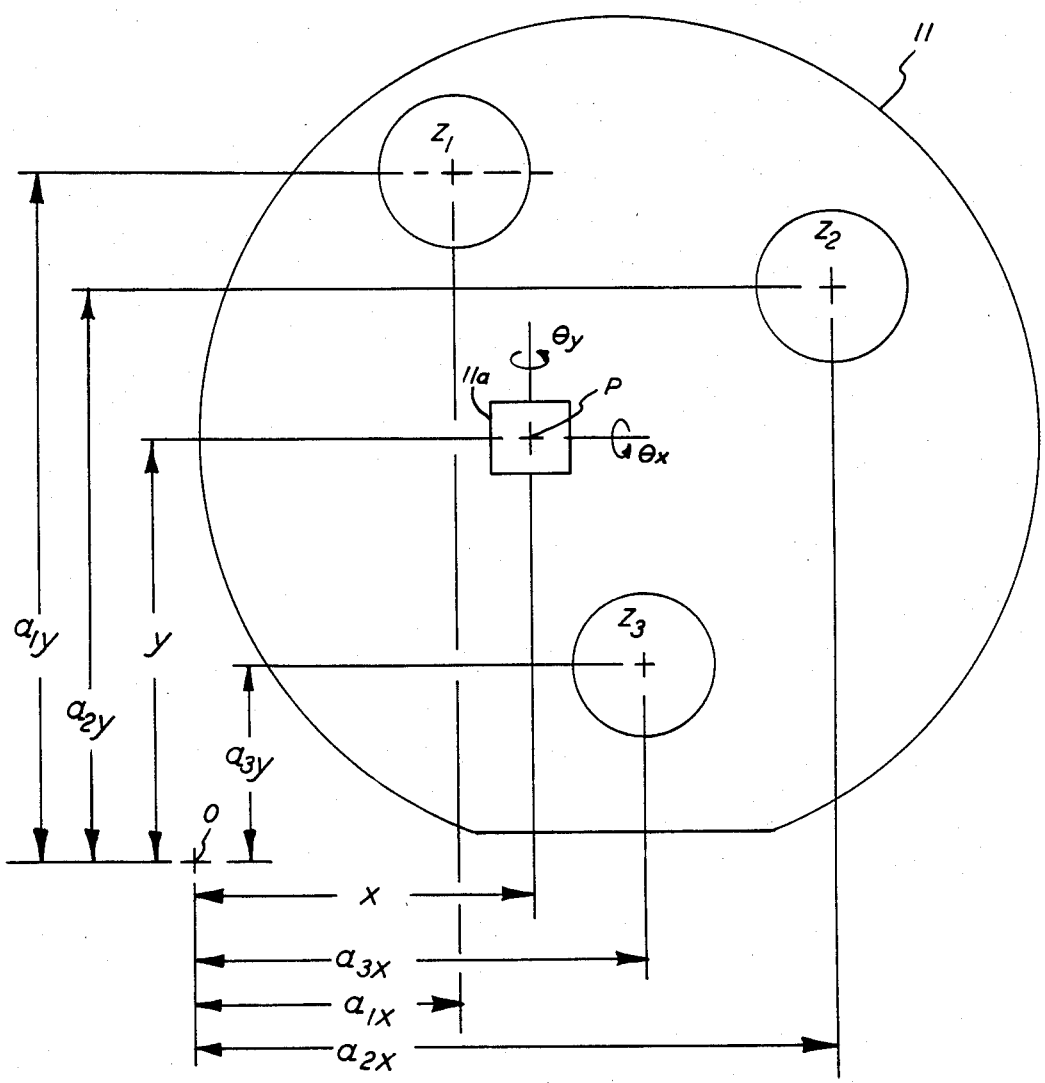
FIG. 1 is a representation showing the geometrical relationships of the present invention.

In FIG. 1 a wafer 11 is shown in operative relationship to the actuator arms of three servo motors $Z_1$, $Z_2$ and $Z_3$. The servo motors $Z_1$, $Z_2$ and $Z_3$ may be of the permanent magnetic brushless type commercially available from Aeroflex Laboratories, Inc. In a practical embodiment of the present invention wafer 11 is secured to the surface of a table or stage (not shown) which is affixed to the actuator arms of the servo motors.

The center P of the subfield 11a of the wafer 11 is defined by the coordinates X and Y as shown in FIG. 1. As the apparatus of the present invention changes subfield as in a step and repeat system these X and Y coordinates vary.

The relationship of each of the centers of the servo motors $Z_1$, $Z_2$ and $Z_3$ from a reference point 0 are represented by six constants $a_1x$, $a_2x$, and $a_3x$, $a_1y$, $a_2y$, and $a_3y$ where:

$a_1x$ is the x distance from point 0 to the center of servo motor $Z_1$, $a_2x$ is the x distance from point 0 to the center of servo motor $Z_2$, $a_3x$ is the x distance from point 0 to the center of servo motor $Z_3$, $a_1y$ is the y distance from point 0 to the center of servo motor $Z_1$, $a_2y$ is the y distance from point 0 to the center of servo motor $Z_2$, and $a_3y$ is the y distance from point 0 to the center of servo motor $Z_3$.

The values $\theta x$ and $\theta y$ represent the degree tilt error about the X and Y axes of the subfield 11a. This tilt is the degree of deviation of the wafer 11 or table on which it rests from a predetermined focal plane. The distance the subfield 11a is displaced from the focal plane is a distance represented by the variable f.

Assuming that signals representative of the three error signals $\theta x$, $\theta y$ and f are available, these must be converted to three commands to the servo motors $Z_1$, $Z_2$ and $Z_3$. The algebraic expressions for these quantities is given by:

$$\bar{Z}_1 = (X - a_1x)\theta y + (Y - a_1y)\theta x + f \quad (1)$$

$$\bar{Z}_2 = (X - a_2x)\theta y + (Y - a_2y)\theta x + f \quad (2)$$

$$\bar{Z}_3 = (X - a_3x)\theta y + (Y - a_3y)\theta x + f \quad (3)$$

This expression also includes quantities representative of the variables X and Y which change for each subfield. In addition, the constant $a_1x$, $a_2x$, $a_3x$, $a_1y$, $a_2y$ and $a_3y$ also form part of the above expression.

Figure 2:
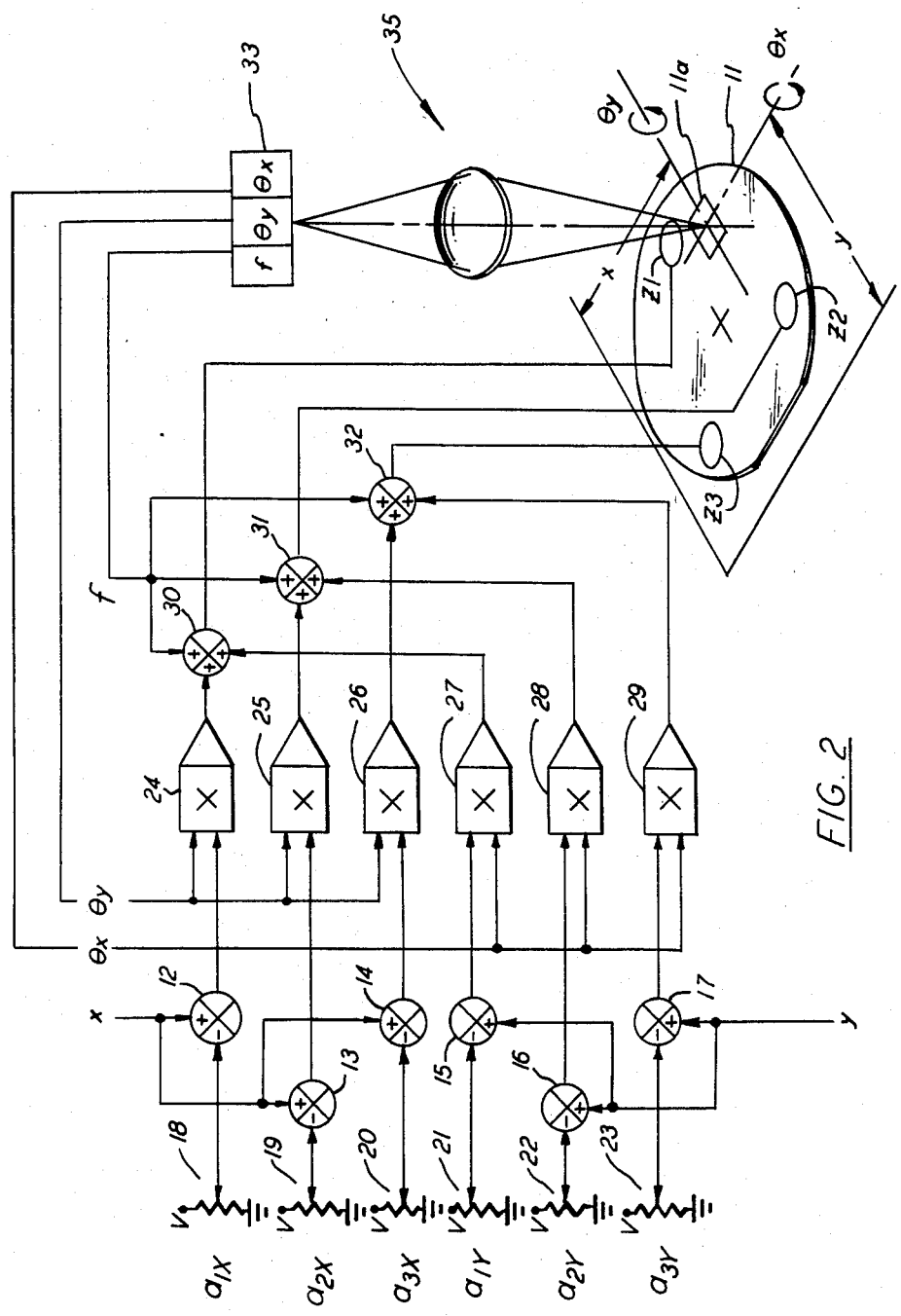
FIG. 2 is a representation partly in block diagram and partly in pictorial of a preferred embodiment of the present invention.

FIG. 2 illustrates a system providing a dynamic solution to the above algegraic expression for each subfield. In so doing the circuit of FIG. 2 provides appropriate inputs to servo motors $Z_1$, $Z_2$ and $Z_3$ so that their associated actuators provide continuous tilt and focus correction for each subfield as an exposure system scans each subfield and steps from subfield to subfield in accordance with a predetermined stepping scheme.

More particularly, FIG. 2 comprises subtractor circuits 12, 13, 14, 15, 16 and 17. Signals, i.e., voltage levels representative of the constants $a_1x$, $a_2x$ and $a_3x$, $a_1y$, $a_2y$ and $a_3y$ are provided as inputs to the subtrahend side of subtractor circuits 12, 13, 14, 15, 16 and 17, respectively. The voltages representative of the constants $a_1x$, $a_2x$, $a_3x$, $a_1y$, $a_2y$ and $a_3y$ may, for example, be provided by potentiometers 18, 19, 20, 21, 22, and 23. Each potentiometer may comprise a resistor $R_1$, $R_2$, $R_3$, $R_4$, $R_5$ and $R_6$ connected to a source V of electrical potential and ground. The wiper arm associated with each resistor is used to set the level of voltage provided as inputs to subtractor circuits 12–17 to the proper level.

The minuend side of subtractor circuits 12, 13 and 14 are provided input signals representative of the X coordinate of the center P of each subfield 11a which changes in position as the exposure system is stepped across the surface of the wafer 11. Similarly, the minuend side of subtractor circuits 15, 16 and 17 are provided input signals representative of the Y coordinate of the center P of each subfield 11a which changes in position as the exposure system is stepped across the surface of the wafer.

In a practical embodiment the stage which supports the wafer is moved in a stepwise fashion to place each subfield in its turn in position within the optical field. Movement of the stage in the X and Y directions is detected by sensors which provide voltages proportional to distance of the stage in the X and Y directions from a known reference. These voltages provide the inputs X and Y representative of the coordinates of the particular subfield undergoing exposure. Systems for obtaining voltages representative of X and Y displacement of an object from a reference are well known. Three such systems employing interferometric techniques are disclosed in U.S. Pat. Nos. 4,311,390; 3,791,739 and 3,622,244.

The outputs from the subtractor circuits 12, 13, 14, 15, 16 and 17 are the quantities $(X-A_1x)$, $(X-A_2x)$, $(X-A_3x)$, $(Y-A_1y)$, $(Y-A_2y)$ and $(Y-A_3y)$, respectively. These outputs are, respectively, provided as inputs to multiplier circuits 24, 25, 26, 27, 28 and 29. Multiplier circuits 24, 25 and 26 also receive inputs, representative of the tilt error $\theta y$, i.e., the angular deviation about the Y axis of a particular subfield from a predetermined plane. Similarly, multiplier circuits 27, 28 and 29 receive inputs representative of the tilt error $\theta x$, i.e., the angular deviation about the X axis of the subfield from a predetermined plane. Multiplier circuits 24, 25 and 26, respectively, provide their outputs to adder circuits 30, 31 and 32. The multiplier circuits 27, 28 and 29, respectively, provide their outputs to adder circuits 30, 31 and 32. The third input to each of add circuits 30, 31 and 32 is the signal f representative of the focus error of a particular subfield, i.e., distance the subfield is spaced from a predetermined focal plane.

Each of the error signals $\theta x$, $\theta y$ and f are provided by component 33 which forms part of a "through the lens" sensing system 35.

Figure 3:
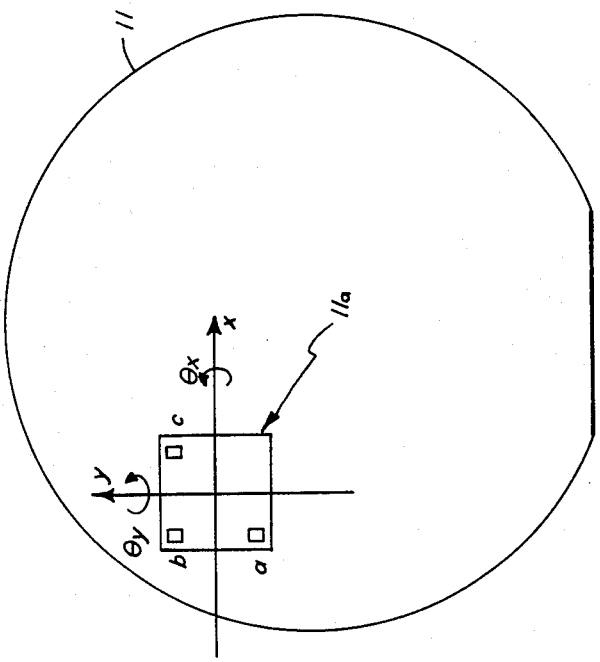
FIG. 3 shows the areas with a wafer subfield at which focus is measured.

The "through the lens" optical sensing system 35 of the present invention functions to obtain the error signals $\theta x$, $\theta y$ and f by measuring focus at three separate locations near a corner of a subfield. As shown in FIG. 3 areas a, b and c depict the locations. The difference between the focus error signals at locations a and b is a measure of tilt about the x axis and produces the error signal $\theta x$. The difference between the focus error signals at locations b and c is a measure of tilt about the y-axis and provides the error signal $\theta y$. The sum of the focus error at locations a, b and c is a measure of the focus error of the subfield 11a and provides the focus error signal f.

Figure 4:
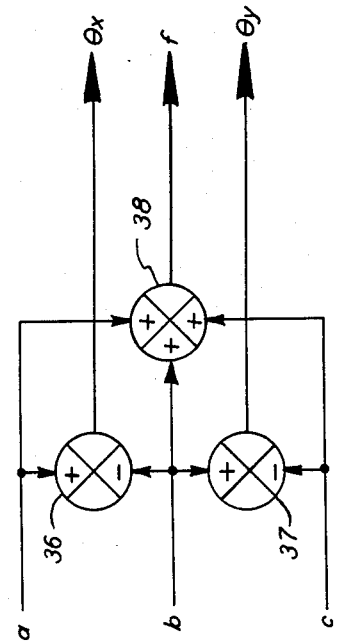
FIG. 4 illustrates in block diagram form a logic circuit for converting focus signals into the appropriate error signals.

FIG. 4 illustrates a logic circuit for processing the focus error signals derived from locations a, b and c to provide the required error signals $\theta x$, $\theta y$ and f. It comprises a subtractor 36 which takes the difference of focus error signals a and b to provide error signal $\theta x$, a subtractor 37 which takes the difference of focus error signals b and c to provide error signal $\theta x$, and summing circuit 38 which adds focus error signals a, b and c to provide focus error signal f.

Figure 5:
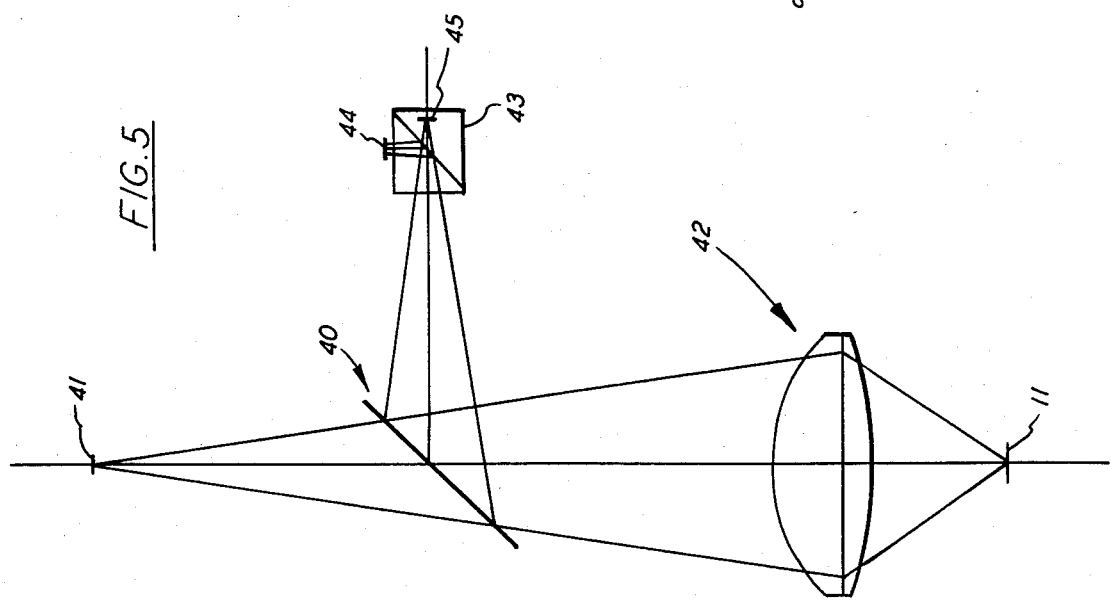
FIG. 5 illustrates a portion of a "through the lens" focus measuring system for providing the focus signals at the three locations shown in FIG. 3.

FIG. 5 illustrates an essential component for obtaining the focus error signals a, b and c. It comprises a beam splitter 40 disposed in the optical path between the reticle or mask 41 and the projection optics 42 which focuses any image on the reticle or mask 41 onto wafer 11 or more precisely onto the selected subfield 11a within wafer 11.

On the reticle 41 there are disposed ruled patterns consisting of alternate opaque and transparent lines at locations corresponding to locations a, b and c on the selected subfield 11a.

A second beam splitter 43 is disposed near the focal plane of the system. For each of the focus detector locations there is a pair of linear array detectors. The linear array detectors which are well known devices and which may be of the type produced and sold by Reticon Corporation of Sunnyvale, Calif. provide output voltage signals representative of the intensity of light. One detector 44 of each pair is located slightly in front of the focal plane while the other detector 45 is located slightly behind the focal plane. While only two detectors 44 and 45 are shown it should be noted that there is a pair for each of the three locations a, b and c.

Considering just location a on the subfield its counterpart focus error signal is provided when light is projected through reticle 41 imaging the opaque and transparent lined pattern on the reticle corresponding to location a on the subfield 11a. This pattern is reflected from the wafer subfield 11a and beam splitter 40 onto beamsplitter 43 where it is again split and transmitted to detectors 44 and 45. Since one detector is positioned just behind the focal plane and the other is positioned just in front of the focal plane, the output from the detectors is a function of the focus error of the location a on the subfield 11a. For example, when the lined pattern from the reticle 41 is in focus on the wafer, the images on the detectors 44 and 45 are both slightly out of focus in equal and opposite directions and the output from each is equal and opposite. However, when the wafer is moved out of focus, the output from one detector increases while that of the other detector decreases. Thus, the system provides an unambiguous indication of focus error a in magnitude and direction.

In a similar manner the focus error signals b and c are provided. The three focus error signals a, b and c are processed as described above in reference to FIG. 3 to produce the error signals $\theta x$, $\theta y$ and f which are used in the circuit of FIG. 2 to correct for tilt and focus of the selected subfield.

The outputs from add circuits 30, 31 and 32 are provided as inputs to servo motors $Z_1$, $Z_2$, and $Z_3$, respectively.

These are the quantities represented by $Z_1$, $Z_2$ and $Z_3$ of equations 1, 2, and 3. The bar is used only to differentiate the Z quantities from their associated servo motors.

The outputs from the adder circuits 30, 31 and 32 actuate servo motors $Z_1$, $Z_2$ and $Z_3$ which in turn adjust tilt and focus of the wafer 11 for each wafer subfield until the error signals $\theta x$, $\theta y$ and f become zero. After exposure the same process is repeated for the next subfield in a step and repeat system.

Other modifications of the present invention are possible in light of the above description which should not be deemed as placing limitations on the invention beyond those expressly set forth in the claims which follow:

What is claimed is:

1. An apparatus for correcting tilt and focus errors in a mask projection system for a plurality of subfields on a wafer which vary in position about the surface of the wafer according to a predetermined scheme, comprising in combination:
    table means for supporting a wafer and movable about the X and Y axis and in the Z direction;
    first, second and third servo motors;
    each of said servo motors having actuators fixed to said table means;
    first means for providing signals proportional to deviation of each wafer subfield in the Z direction and about the X and Y axes from a predetermined focal plane;
    second means providing signals representative of the X and Y coordinates of the center of each subfield;
    third means providing signals representative of the X and Y coordinates of the actuators of each of said three servo motors relative to a reference point;
    analog circuit means connected to said first, second, and third means for solving the equations;
    $Z_1 = (X - a_1x)\theta y + (Y - a_1y)\theta x + f$ $Z_2 = (X - a_2x)\theta y + (Y - a_2y)\theta x + f$ $Z_3 = (Y - a_3x)\theta y + (Y - a_3y)\theta x + f$ wherein:
    X is the X coordinate of the center of the subfield,
    Y is the Y coordinate of the center of the subfield,
    f is deviation of the wafer table means form the predetermined focal plane,
    $\theta x$ is the deviation in tilt about the X axis,
    $\theta y$ is the deviation in tilt about the axis,
    $a_1x$, $a_2x$, $a_3x$ are the respected distances in the X direction of the first, second and third servo motors from the reference point, and
    $a_1y$, $a_2y$, $a_3y$ are the respected distances in the Y direction of the first, second and third servo motors from the reference point,
    said circuit means applying the $Z_1$, $Z_2$ and $Z_3$ solutions to said first, second and third servo motors for causing said actuators to correct the deviations of said wafer from said predetermined focal plane.

2. An apparatus according to claim 1 wherein said first means comprises;
    a through the lens sensing system which is centered on the particular subfield to be corrected in focus and tilt.

3. An apparatus according to claim 2 wherein said second means comprises;
    interferometric measuring means.

4. An apparatus according to claim 3 wherein said third means comprises;
    first, second, third, fourth, fifth and sixth potentiometers means providing signals representative of the distances from a reference point of said first, second and third servo motors in the X and Y directions.

5. An apparatus according to claim 4 wherein said analog circuit means comprises,
    first, second, third, fourth, fifth and sixth subtractor means,
    said first, second, third, fourth, fifth and sixth potentiometer means connected to the subtrahend portion of said first, second, third, fourth, fifth and sixth subtractor means,
    said second means connected to provide inputs representative of the X coordinates of the center of each subfield to the minuend portion of said first, second and third subtractor means and inputs representative of the Y coordinates of the center of each subfield to the minuend portion of said fourth, fifth and sixth subtractor means,
    first, second, third, fourth, fifth and sixth multiplier means connected to receive the outputs of said first, second, third, fourth, fifth and sixth subtractor means, respectively,
    said first, second and third multiplier means connected to said first means to receive the signal proportional to deviation of each wafer subfield about the Y axis as an input,
    said fourth, fifth and sixth multiplier means connected to said first means to receive the signal proportional to deviation of each wafer subfield about the X axis as an input,
    first adder means connected to receive the outputs of said first and fourth multiplier,
    second adder means connected to receive the outputs from said second and fifth multiplier means,
    third adder means connected to receive the outputs from said third and sixth multiplier means,
    said first, second and third adder means connected to said first means to receive the signal representative of the deviation of each wafer subfield in the Z direction from said predetermined focal plane,
    said first, second and third adder means connected to said first, second and third servo motors, respectively.

* * * * *